US006820243B1

(12) United States Patent
Shey et al.

(10) Patent No.: US 6,820,243 B1
(45) Date of Patent: Nov. 16, 2004

(54) HYBRID SYSTEM OF STATIC ANALYSIS AND DYNAMIC SIMULATION FOR CIRCUIT DESIGN

(75) Inventors: An-Jui Shey, Fremont, CA (US); Henry Horng-Fei Jyu, Sunnyvale, CA (US); An-Chang Deng, Saratoga, CA (US)

(73) Assignee: Nassda Corporation, Santa Clara, CA (US)

( * ) Notice: Subject to any disclaimer, the term of this patent is extended or adjusted under 35 U.S.C. 154(b) by 131 days.

(21) Appl. No.: 09/957,092

(22) Filed: Sep. 19, 2001

(51) Int. Cl.[7] ............................. G06F 17/50; G06F 9/45
(52) U.S. Cl. ................................. 716/4; 716/5; 703/14
(58) Field of Search ........................... 716/4, 5; 703/14

(56) References Cited

U.S. PATENT DOCUMENTS

| | | | | |
|---|---|---|---|---|
| 4,792,913 A | * | 12/1988 | Buckland et al. | 708/3 |
| 5,084,824 A | * | 1/1992 | Lam et al. | 716/11 |
| 5,258,919 A | * | 11/1993 | Yamanouchi et al. | 716/11 |
| 5,325,309 A | * | 6/1994 | Halaviati et al. | 703/15 |
| 5,481,484 A | * | 1/1996 | Ogawa et al. | 703/14 |
| 5,553,008 A | * | 9/1996 | Huang et al. | 703/14 |
| 5,903,577 A | | 5/1999 | Teene | 371/22.1 |
| 5,983,381 A | * | 11/1999 | Chakradhar et al. | 714/738 |
| 6,145,106 A | * | 11/2000 | Chakradhar et al. | 714/742 |
| 6,249,898 B1 | | 6/2001 | Koh et al. | 716/4 |
| 6,308,300 B1 | * | 10/2001 | Bushnell et al. | 716/4 |
| 6,397,172 B1 | * | 5/2002 | Gurney | 703/14 |
| 2002/0049576 A1 | * | 4/2002 | Meyer | 703/14 |

OTHER PUBLICATIONS

Acuna et al., Simulation Techniques for Mixed Analog/Digital Circuits, IEEE Journal of Solid State Circuits, pp. 353–363, Apr. 1990.*

J. Watts et al., ROOMMS, A Relaxation–based, Object–Oriented, Mixed–Mode Simulator, Proceedings of the IEEE Custom Integrated Circuits Conference, pp. 5.3/1–5.3/4, May 1990.*

K. Suyama et al., Simulation of Mixed Switched–Capacitor/Digital Networks with Signal–Driven Switches, IEEE Journal of Solid State Circuits, pp. 1403–1413, Dec. 1990.*

T. Thatcher et al., Automatic Partitioning and Dynamic Mixed–Mode Simulation, Proceedings of the IEEE Custom Integrated Circuits Conference, pp. 12.7.1–12.7.4, May 1992.*

E.L. Acuna et al., iSPLICE3: A New Simulator for Mixed Analog/Digital Circuits, IEEE 1989 Custom Integrated Circuits Conference, pp. 13.1.1–13.1.4, May 1989.*

D. Brand and V. S. Iyengar in "Timing analysis using functional relationships," IEEE ICCAD '86. Dig. of Tech. Papers, Santa Clara, CA. pp. 126–129, Nov. 1986.

Robert B. Hitchcock et al., "Timing Analysis of Computer Hardware," IBM J. Res. Develop., vol. 26, No. 1, pp. 100–105, Jan. 1982.

Kenneth S. Kundert, "A Sparse Linear Equation Solver" downloaded Sep. 11, 2001 from <http://www.netlib.org/sparse>.

A. Vladimirescu, K. Zhang, A. Newton and D. Peterson, "The SPICE Circuit Simulator, SPICE Version 2G User's Guide" EECS Dept. of U.C. Berkely, Aug. 1981.

(List continued on next page.)

Primary Examiner—A. M. Thompson
(74) Attorney, Agent, or Firm—Fish & Richardson P.C.

(57) ABSTRACT

A method and system for simulating a circuit design that includes analog and/or digital circuitry uses a hybrid system of static analysis and dynamic simulation. Once the user's circuit is read in and partitioned into stages, the input vectors are applied. A hybrid vector is used to represent a number of possible signal states, for example, a logic 0 or logic 1, as well as a number of possible signal transitions, for example, a rising signal or a falling signal. The possible combinations of states are enumerated and the network in the stage is solved for all possible combinations. The results from the network solutions for the different combinations are recomposed into the hybrid notation, which is then applied to the next stage.

27 Claims, 9 Drawing Sheets

OTHER PUBLICATIONS

SPICE3 Version 3f3 User's Manual (1993).

G. Kron, "A Set of Principles to Interconnect the Solutions of Physical Systems", Aug., 1953, Journal of Applied Physics, vol. 24, No. 8, pp. 965–980.

G. Kron, "Diakoptics—The Piecewise Solution of Large-Scale Systems", 1963, Macdonald, London.

F. H. Branin, "The Relation Between Kron's Method and the Classical Methods of Network Analysis", Mar. 1962, The Matrix and Tensor Quarterly, vol. 12, No. 3, pp. 69–115.

L. O. Chua and L. K. Chen, "Diakoptic and Generalized Hybrid Analysis", Dec. 1976, IEEE Transactions on Circuits and Systems, vol. CAS–23, No. 12, pp. 694–705.

F. F. Wu, "Solution of Large–Scale Networks by Tearing", Dec. 1976, IEEE Transactions on Circuits and Systems, vol. CAS–23, No. 12, pp. 706–713.

L. O. Chua and L. K. Chen, "Nonlinear Diakoptics", Apr. 1975, Proceedings 1975 IEEE International Symposium On Circuits and Systems, pp. 373–376.

K. U. Wang and T. Chao, "Diakoptics for Large Scale Nonlinear Time–Varying Networks", Apr. 1975, Proceedings, 1975 IEEE International Symposium on Circuits and Systems, pp. 277–278.

A. Sangiovanni–Vincentelli, L. K. Chen and L. O. Chua, "A New Tearing Approach–Node Tearing Nodal Analysis", Apr. 1975, 1977 IEEE International Symposium on Circuits and Systems Proceedings, pp. 143–147.

P. Linardis, K. G. Nichols and E. J. Zaluska, Network Partitioning and Latency Exploitation in Time–Domain Analysis of Nonlinear Electronic Circuits, May 1978, 1978 IEEE International Symposium on Circuits and Systems Proceedings, pp. 510–513.

N. B. Rabbat and H. Y. Hsieh, "A Latent Macromodular Approach to Large–Scale Sparse Networks", Dec., 1976, IEEE Transactions on Circuits and Systems, vol. CAS–23, No. 12, pp. 745–752.

N. B. Rabbat and H. Y. Hsieh, "Concepts of Latency in the Time–Domain Solution of Nonlinear Differential Equations", May 1978, 1978 IEEE International Symposium on Circuits and Systems Proceedings, pp. 813–825.

C. W. Ho, A. E. Ruehli and P. A. Brennan, "The Modified Nodal Approach to Network Analysis", Jun., 1975, IEEE Transactions on Circuits and Systems, vol. CAS–22, No. 6, pp. 504–509.

I. N. Hajj, "Sparsity Considerations in Network Solution by Tearing", May 1980, IEEE Transactions on Circuit and Systems, vol. CAS–27, No. 5, pp. 357–366.

A. E. Ruehli, A. L. Sangiovanni–Vincentelli and N. B. Rabbat, "Time Analysis of Large Scale Circuits Containing One–Way Macromodels", Apr. 1980, 1980 IEEE International Symposium on Circuits and Systems Proceedings, pp. 766–770.

N. B. Rabbat, A. L. Sangiovanni–Vincentelli, and H. Y. Hsieh, "A Multilevel Newton Algorithm With Macromodeling and Latency for the Analysis of Large–Scale Nonlinear Circuits in the Time Domain", Sep. 1979, IEEE Transactions on Circuits and Systems, vol. CAS–26, No. 9, pp. 733–741.

H. Y. Hsieh and N. B. Rabbat, Multilevel Newton Algorithm for Nested Macromodel Analysis of Bipolar Networks, Apr., 1980, 1980 IEEE International Symposium on Circuits and Systems Proceedings, vol. 1, pp. 762–765.

M. C. Chang and I. N. Hajj, "iPRIDE" A Parallel Integrated Circuit Simulator Using Direct Method, Nov., 1988, IEEE International Conference on Computer–Aided Design, pp. 304–307.

P. Cox, R. Burch, D. Hocevar and P. Yang, "SUPPLE: Simulator Utilizing Parallel Processing and Latency Exploitation", Nov. 1987, IEEE International Conference on Computer–Aided Design, pp. 368–371.

G. Bischoff and S. Greenberg, "CAYENNE: A Parallel Implementation of the Circuit Simulator Spice", Nov. 1986, IEEE International Conference on Computer–Aided Design, pp. 182–185.

G. K. Jacob, A. R. Newton and D. O. Pederson, "An Empirical Analysis of the Performance of a Multiprocessor–Based Circuit Simulator", Jun., 1986, $23^{rd}$ Design Automation Conference, pp. 588–593.

C. P. Yuan, R. Lucas, P. Chan and R. Dutton, Parallel Electronic Curcuit Simulation on the iPSC System, May, 1988, IEEE 1988 Custom Integrated Circuits Conference, pp. 6.5.1–6.5.4.

J. T. Deutsch and A. R. Newton, A Multiprocessor Implementation of Relaxation–Based Electrical Circuit Simulation, $21^{st}$ Design Automation Conference, pp. 350–357.

A. Vladimirescu and D. O. Pederson, "Circuit Simulation on Vector Processors", Sep.–Oct., 1982, IEEE International Conference on Circuits and Computers, pp. 172–175.

B. Greer, "Converting SPICE to Vector Code", Jan., 1986, VLSI System Des. vol. VII, pp. 30–32.

Ping Yang, "An Investigation of Ordering, Tearing, and Latency Algorithms for the Time–Domain Simulation of Large Circuits", 1980, Graduate College of the University of Illinois at Urbana–Champaign.

* cited by examiner

HYBRID SYSTEM OF STATIC ANALYSIS AND DYNAMIC SIMULATION FOR CIRCUIT DESIGN

BACKGROUND OF THE INVENTION

1. Field of the Invention

The present invention relates to simulation of circuit design and in particular to the combined dynamic and static simulation of a circuit design.

2. Discussion of the Related Art

Electronic design automation (EDA) is now commonly used in the design of integrated circuits. EDA makes extensive use of computers to automate the design process. Once a circuit has been designed and physically laid out, extensive testing is performed to verify that the new design and layout will work as desired. Testing of the new design is typically performed by simulating the design using a computer, which permits relatively fast verification of the circuit without necessitating physically placing the design in silicon.

Static analysis and dynamic simulation are two primary conventional methods employed to analyze and verify circuit behaviors of a design. Static analysis and dynamic simulation are described generally in Robert B. Hitchcock et al., "Timing Analysis of Computer Hardware," IBM J. Res. Develop., vol. 26, No. 1, pp. 100–105, January 1982; and A. Vladimirescu, K. Zhang, A. Newton and D. Pederson, "The SPICE Circuit Simulator, SPICE Version 2G User's Guide" EECS Dept. of U. C. Berkely, August 1981, respectively, both of which are incorporated herein by reference.

Both approaches, however, are appropriate for only certain blocks and both have limitations. Conventionally, static analysis techniques are used on digital circuits. Static analysis has the advantage that input vectors are not used and therefore do not need to be specified by the user. Instead, static analysis is based on worst-case analysis to determine the worst-case delay of the circuit. The critical paths can be determined by propagating a transition through the circuit based on worst-case assumptions. However, because static analysis does not consider concurrent updates of all the signals of the entire circuit, some critical paths that are reported may never happen. This is the so-called "false paths" problem of static timing analysis. False paths are described in more detail by D. Brand and V. S. Iyengar in "Timing analysis using functional relationships," IEEE ICCAD '86. Dig. of Tech. Papers, Santa Clara, Calif. pp. 126–129, November 1986, which is incorporated herein by reference.

An additional limitation of static analysis is that it cannot be used for analog circuits and it has poor accuracy for delay sensitive parasitic elements. Moreover, static analysis has difficulties handling simultaneous input changes, cannot capture incomplete transitions or glitches, and is difficult to use for asynchronous circuits.

Dynamic simulation, on the other hand, is conventionally used on analog circuits. Dynamic simulation applies input vectors, i.e., particular input patterns, to the simulated circuit to determine the resulting output of the circuit. While dynamic simulation can provide higher accuracy than static analysis, dynamic simulation requires a long simulation times because a large number of input vectors must be simulated in order to achieve the true best and worst case results for circuitry having a large number of inputs. In addition, dynamic simulation only provides incomplete worst-case coverage. Moreover, it is difficult to estimate typical power consumption using dynamic simulation.

Silicon technology has advanced to the state that single chips can now be built with more than tens of millions of transistors. This technology promises new levels of integration into a single chip. Circuit designs are expected to increasingly mix analog circuitry, digital circuitry and memory blocks into a single chip, i.e., a system-on-a-chip (SOC). By way of example, FIG. 1 shows a block diagram of a SOC circuit 10 that includes analog circuitry 12, Random Access Memory (RAM) 14, Read Only Memory (ROM) 16 and a digital logic core 18. The combination of mixed analog and digital design, however, requires sophisticated simulation techniques. In particular, a mixed analog/digital simulator must provide both performance for large digital circuitry and accuracy for critical analog circuitry. Neither static analysis nor dynamic simulation can provide the desired performance and accuracy required for simulating mixed analog and digital circuitry.

Thus, there exists a need for an analysis tool for simulating circuit designs that include analog and digital features and that provides the performance of static analysis and the accuracy of dynamic simulation.

SUMMARY

A method and system for simulating a circuit design, which may include analog and digital circuitry, uses a hybrid system of static analysis and dynamic simulation. The hybrid simulation system solves problems associated with traditional static and dynamic approaches, while maintaining the accuracy advantage of dynamic simulation and efficiency advantage of static analysis.

The hybrid simulation system, in accordance with the present invention, reads in the net list of the user's circuit design, partitions the circuit design into a plurality of stages, then applies the input vectors. The hybrid simulation system uses a unique hybrid vector notation, where a hybrid vector can represent a number of possible static signal states, i.e., a logic 0 or logic 1, as well as a number of possible dynamic signal transitions, i.e., a rising signal or a falling signal. The possible combinations of states and transitions are enumerated and the network in the stage is solved for all possible combinations. The results from the network solutions for all the different combinations of states and transitions are recomposed into the hybrid notation, which is then applied to the next stage.

The hybrid simulation system in accordance with the present invention includes storing device information and node connectivity of the circuit design and partitioning the circuit design into a plurality of stages. At least one input vector is applied to the stage, wherein at least one input vector is a hybrid vector that represents a plurality of possible signal states. The possible combinations of signal states of the at least one input vector in the stage are enumerated and the network in the stage is solved for all the possible combinations of signal states. The output of the stage is updated with an output vector, which may also be a hybrid vector that represents a plurality of possible signal states. The hybrid vector can also represent a plurality of possible signal transitions in addition to a plurality of possible signal states.

The hybrid simulation system may further include applying one of patterns of the possible combinations of signal states and signal transitions to the stage and solving the network in the stage for that pattern. The resulting output vector is stored in an output array of patterns of possible combinations of signal states and signal transitions. The acts of applying one of the patterns to the stage, solving the network for the stage and storing the result in the output array are repeated until all the patterns have been applied and solved. The output vectors for the stage are then updated by recomposing the possible patterns from the output array into output vectors that represent a plurality of possible signal states and possible signal transitions. The output vectors for the current stage may represent an input vector for the next stage and hence trigger the simulation of the next stage.

The process continues for each stage until a final output for the user's circuit design is achieved. The enumeration and analysis of some stages may be skipped under isome conditions. For example, if the input vectors are changing into a superset of the previous vector, and the output vector of the stage represents all possible signal transitions. A state is a superset of another state if the second state represents a plurality of possible signal states (or signal transitions), one of which is the same as the first state.

The enumeration can be skipped, but the analysis still performed, if each input vector to the stage represents only one possible signal state, or if the input vector has changed from the previous state, then both the current and previous states represent only one possible signal state and all prior input vectors represent only one possible signal state.

In addition, the hybrid simulation system advantageously reduces effective size of large stages by further partitioning, which decreases the time required to analyze the stage. The further partitioning is performed based on the mutual exclusivity of controlling nodes within the large stage. The devices with mutual exclusive controlling nodes are broken apart to from sub-stages. After enumerating the possible combinations from the input vectors, the hybrid simulation system dynamically recombines those sub-stages that are non-mutually exclusive with the controlling signal of the triggering input devices. Analysis is then performed on the recombined sub-stages. Additionally, false state input enumeration is eliminated in accordance with the present invention by combining affected stages into a complex cell. The enumeration is performed at the complex cell level, while the analysis is performed at the constituent stage level.

The hybrid simulation system of the present invention may be a computer implemented method of simulating a circuit design, that includes analog and digital circuitry, or it may be incorporated into a computer-usable medium having computer-readable program code embodied in a device for causing a computer to perform the hybrid simulation.

DETAILED DESCRIPTION

A hybrid simulation system, in accordance with the present invention, uses a hybrid system of static analysis and dynamic simulation to handle a user's circuit design that include both analog and digital circuitry. The hybrid simulation system may be used for signal integrity analysis, block characterizations, and timing verification of complex circuits. Advantageously, the hybrid simulation system integrates the traditionally separated processes of verifying analog and digital blocks thereby maintaining the accuracy of dynamic simulation and efficiency of static analysis, while avoiding the disadvantages of these approaches. The hybrid simulation system provides an effective simulation approach to overcome difficult problems such as A/D signal interface, non-convergence due to strong global feedback. The hybrid simulation system eliminates the lengthy and error-prone procedures of handling the analog/digital interface for full-chip verification and makes verification of SOC designs efficiently feasible.

Figure 1:
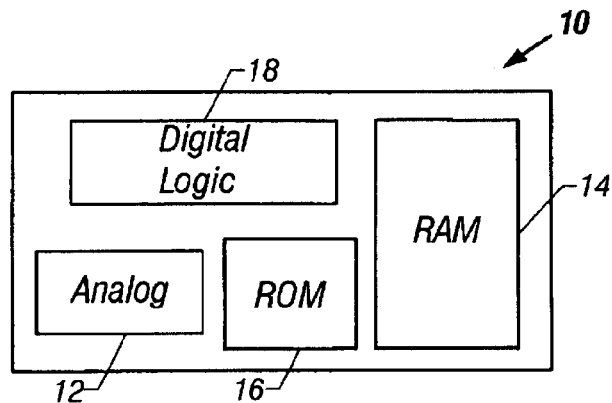
FIG. 1 shows a block diagram of a circuit that includes analog circuitry 12, Random Access Memory (RAM), Read Only Memory (ROM) and a digital logic core.
Figure 2:
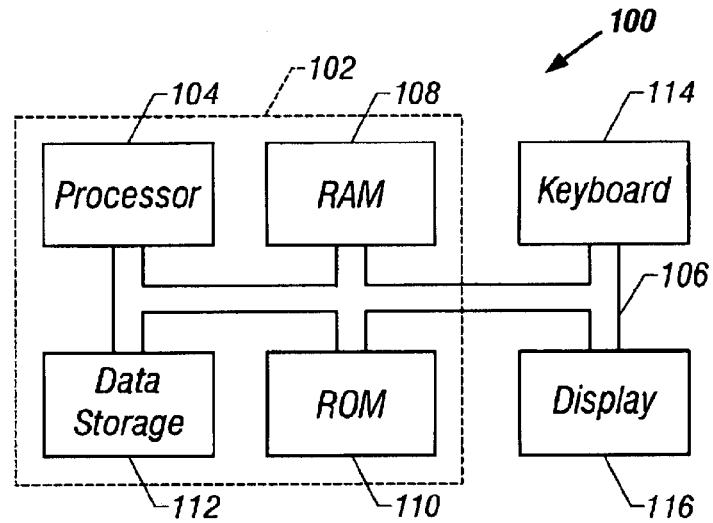
FIG. 2 shows an exemplary computer system used as a part of the hybrid simulation system in accordance with one embodiment of the present invention.

Portions of the hybrid simulation system are comprised of computer-readable and computer-executable instructions that reside, for example, in computer-usable media of a computer system. FIG. 2 shows an exemplary computer system 100 used as a part of the hybrid simulation system in accordance with one embodiment of the present invention.

As shown in FIG. 2, system 100 includes a computer 102 that includes a central processor unit 104 for processing information and instructions and which is coupled to an address/data bus 106. Computer 102 also includes computer usable volatile memory, i.e., random access memory (RAM) 108, which is coupled to bus 106 and stores information and instructions for central processor unit 104. Computer 102 includes computer usable non-volatile memory, i.e., read only memory (ROM) 108, which is coupled to bus 106 and is used for storing static information and instructions for the central processor unit 104. Computer 102 also includes a data storage device 112, e.g., a magnetic or optical disk and disk drive, coupled to bus 106 for storing information and instructions. Computer system 100 also includes a keyboard 114 (and mouse) coupled to bus 106 for communicating information and command selections to central processor unit 104. A display device 116 coupled to bus 106 is included for displaying information to the user. The display device 116 may be, e.g., a monitor and/or printer.

It should be understood that computer system 100 is exemplary only and that the present invention can operate within a number of different computer systems including general purpose computer systems, embedded computer systems, and stand alone computer systems specially adapted for hybrid simulation systems. Those of ordinary skill in the art will understand that the hardware of computer system 100 shown in FIG. 2 may vary. For example, other peripheral devices, such as modems, optical disk drives and the like may be used in addition to or in place of some of the hardware shown in FIG. 2. Moreover, it should be understood that any desired and appropriate bus architecture may be used to interconnect the various hardware devices in computer system 100. The depicted example in FIG. 2 is not meant to imply architectural limitations with respect to the present invention.

The hybrid simulation system is a computer implemented system that imports the user's circuit design which may include analog and digital circuit blocks. Typically, the digital circuit blocks will include a large number of input vector combinations. The hybrid simulation system uses an analysis technique that is an extension of dynamic simulation that incorporates static analysis techniques to avoid the requirement of exhaustive input pattern specifications for digital blocks in order to guarantee full coverage of the worst-case circuit characteristics and behaviors. The hybrid simulation system advantageously includes a hybrid state notation to accommodate the many input combinations of the digital block. Signals that propagate through the interface between analog/digital blocks are automatically converted using the hybrid state notation.

The hybrid state notation includes regular steady state values, i.e., logic 0 and logic 1, as well as four additional states; "X," "R," "F" and "T." The "X" state represents a static state that is unknown and can be either 0 or 1. The "R," "F," and "T" states are possible transition states representing rise, fall and toggle transitions, respectively, that may occur within a timing window. The rising state R represents a possible transition state that at any time within a timing window can be rising, a logic 0 or a logic 1. The falling state R similarly represents a possible transition state that can be falling, a logic 0 or a logic 1. The toggle state "T" represents a possible transition state that can be rising, falling, a logic 0 or a logic 1. Table 1 illustrates the possible states used by the hybrid simulation system in accordance with the present invention.

TABLE 1

| State | Value | Relationship of States |
|---|---|---|
| 0 | Low | |
| 1 | High | |
| X | Possibly 0 or 1 | A superset of state 0 and state 1 |
| R | Possible Rising Transition, 0, or 1 | A superset of X |
| F | Possible Falling Transition, 0, or 1 | A superset of X |
| T | Possible R, F, 0, or 1 | A superset of state R and state F |

Thus, state X covers all uncertain static states while states R, F, and T cover all the dynamic transitions. The R, F, and T transition states are dynamic with the earliest delay occurring at front (leading) edge of the timing window and the latest delay occurring at rear (trailing) edge of timing window.

Figure 3:
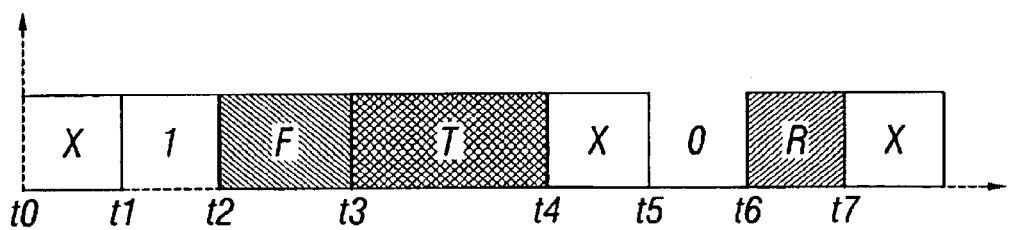
FIG. 3 illustrates a timing diagram used by the hybrid simulation system in accordance with the present invention.

FIG. 3 illustrates a timing diagram with timing window t0 to t7 used by the hybrid simulation system in accordance with the present invention. As shown in FIG. 3, the signal has an X state, i.e., an uncertain static state within the timing window between times t0 and t1, and a logic 1 within the timing window between times t1 and t2. In the timing window between times t2 and t3, the signal has an F transition state, indicating that a falling transition happens at the earliest at time t2 and at the latest at time t3. Thus, at any time within the timing window between time t2 and t3, the signal state is a logic 0, logic 1 or falling. A T transition state occurs within the timing window between times t3 and t4, indicating that at anytime between times t3 and t4, the signal is a logic 0 a logic 1, rising or falling. Another X state occurs in the timing window between times t4 and t5 and after time t7. A logic 0 occurs in the window between times t5 and t6 and an R state, i.e., a possible rising transition, occurs in the window between times t6 and t7.

The hybrid simulation system can be viewed as an extension of dynamic simulation in that it can handle more hybrid states, i.e., 0, 1, X, R, F, and T. The extension in the number of states the system can handle permits the system to achieve the worst-case coverage like static analysis.

Under hybrid state notations, a succinct vector covers a wide range of vectors. Typically, well-defined states (0 and 1) are specified on control signals while uncertain states (X, R, F and T) are specified on data path signals, which permits modal analysis. In addition, the concurrent simulation for propagating transitions can also eliminate false paths.

FIGS. 4, 6 through 9, 13 and 15 are flow charts of the operation of the hybrid simulation system in accordance with an embodiment of the present invention. The processes of the present hybrid simulation system are carried out, in certain embodiments, by processor 104 under the control of computer-readable and computer-executable instructions. These instructions reside, for example, in data storage features such as RAM 108 and ROM 110 as well as data storage 112 of FIG. 2. The computer-readable and computer-executable instructions are used to implement, for example, the operations related to hybrid simulation as performed by the present system.

Figure 4:
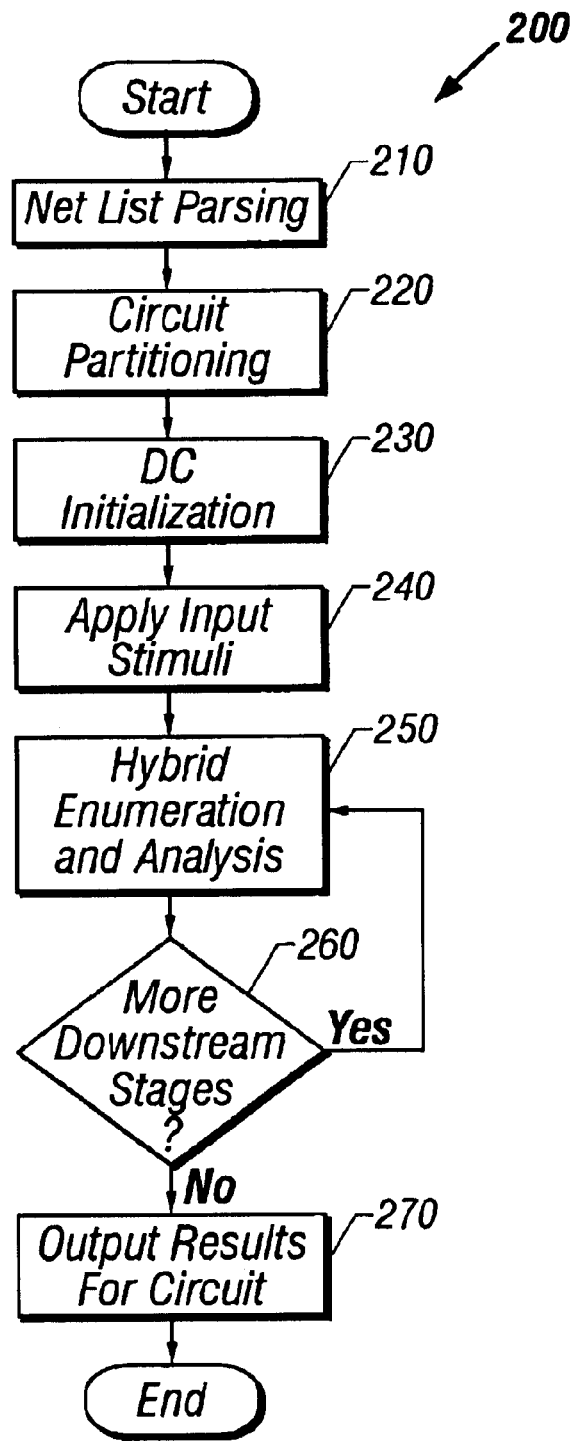
FIG. 4 is a flow chart 200 that shows the hybrid simulation process.

FIG. 4 is a flow chart 200 that shows the hybrid simulation process. As shown in FIG. 4, the operation of the hybrid simulation system first performs net list parsing (block 210). The net list parser reads in the given net list of the user's circuit including device models and input stimuli and stores this information in memory in computer system 100, e.g., in RAM 108 and/or data storage 112.

The input stimuli used by the hybrid simulation system includes both static and dynamic input values, similar to that shown in FIG. 3. For the analog circuit blocks in the user's circuit, the input signals can be specified using the voltage sources for the voltage waveforms designed to drive the circuitry, similar to conventional dynamic circuit simulators such as SPICE. SPICE is described in more detail, e.g., in T. Quarles, A. R. Newton, D. O. Pederson, A Sangiovanni-Vincentelli "SPICE3 User's Manual" EECS department, UC Berkeley, May, 1993, which is incorporated herein by reference. For the digital circuit blocks, however, the hybrid simulation system supports conventional input signal values, i.e., logic 0 and 1, as well as the static X state and dynamic R, F, and T states.

The syntax for specifying input stimuli with hybrid notation uses a time-state pair. Thus, for example, the waveform in FIG. 3 can be specified by the following syntax: to X t1 1 t2 F t3 T t4 X t5 0 t6 R t7 X.

Except for the specification of input stimuli with hybrid notation, parser conventionally builds up a hierarchical device and net connectivity database, which will later be used for simulation.

After net list parsing (block 210), the hybrid simulation system may perform a configuration setup routine, during which user may provide additional data that will assist and/or control the operation of the hybrid simulation system. For example, the user may include information relating to internal loops in the circuitry, which may be used during partitioning. Alternatively, the user may include instructions as to what type of information is desired as the output, e.g., signal integrity analysis, block characterization, or timing verification.

Next, the circuit is partitioned into stages (block 220). During stage partitioning the hybrid simulation system will search and mark cross-coupled device structures to ensure those devices will be clustered into the same stage after the connectivity database becomes available. By placing cross-coupled device structures within the same stage, the hybrid simulation system can eliminate loops for X-event propagation. In addition, the hybrid simulation system performs signal flow analysis based on net connectivity and input/output port information of circuit cells (sub-circuits) to determine the possible signal flow direction through the devices in the user's circuit. By analyzing the direction of signal flow, the devices can be grouped accordingly. In addition, with a high percentage of the devices having the direction set, the hybrid simulation system benefits with an increase in the speed of circuit traversal, false path elimination, and further decomposition of large channel-connected stages.

The hybrid simulation system partitions (block 220) the user's circuitry into channel-connected stages similar to conventional stage partitioning used in SPICE-like circuit simulators. A channel-connected stage is a group of devices that are connected by source and drain terminals to one another and to voltage supply and ground nets. A channel-connected stage boundary is found where the source or drain channel is connected to the gate of another transistor. Analog circuitry is partitioned in a similar manner. Consequently, direct current (DC) flow, if any, is confined within a stage and is absent across stage boundaries. Accordingly, each individual channel-connected stage can be accurately evaluated for circuit characteristics such as signal propagation delay, transition power consumption, and other such desired characteristics.

If a channel-connected stage is large, e.g., exceeds a threshold number of nodes within the stage, further partitioning of that stage may occur, as will be discussed further in reference to FIG. 13.

Next, the partitioned stages are ordered from the primary inputs following the signal flow direction for DC initialization (block 230). During the ordering process, the loop nodes are marked for later loop detection use during the hybrid analysis. The initial input states at the primary inputs are then propagated through the various stages to the primary output nodes.

Figure 5:
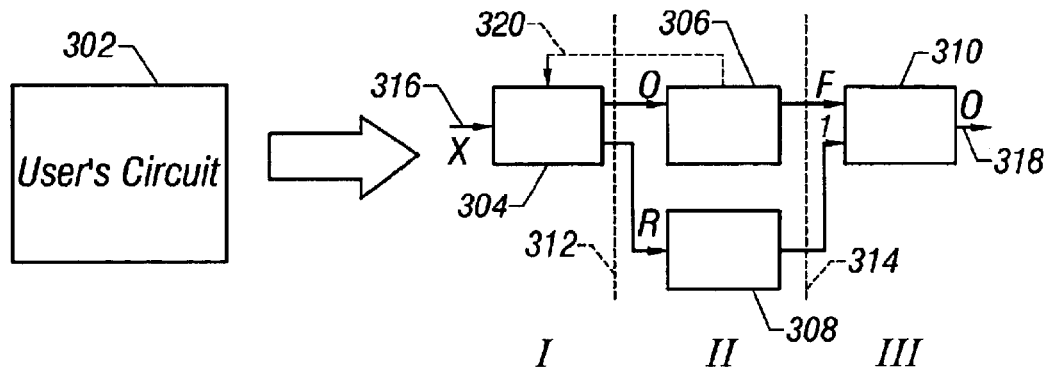
FIG. 5 is a block diagram of a user's circuit that is partitioned into a number of stages.

FIG. 5 is a block diagram of a user's circuit 302 that is partitioned into a number of stages 304, 306, 308, and 310. As shown in FIG. 5, the circuit 302 is ordered into three levels, where stage 304 is in a first level, stages 306 and 308 are in a second level, and stage 310 is in a third level. The initial value X at the primary input 316 is then propagated through the various levels of stages to the primary output 318 at stage 318. The state at the inputs/outputs of each stage is recorded. Thus, stage 320 produces two output signals in response to the initial value of X at the primary input 316, i.e., a logic 0 and an R state. Stage 306 receives the logic 0 from stage 306 produces an F state and stage 308 receives the logic R from stage 308 and produces a logic 1. The final stage 310 receives the F state from stage 306 and the logic 1 from stage 308 and produces a logic 0 on the primary output 318.

Ideally, all loop nodes occur within a stage. However, if there is a loop node, e.g., line 320, between stages, it is marked so that during the hybrid analysis the loop is recognized.

It should be understood, of course, that FIG. 5 is exemplary and that a user's circuit may be partitioned into many levels and many stages. Additionally, while only one primary input and one primary output are shown in FIG. 5, there may be any desired number of primary inputs and primary outputs.

The process of ordering and propagation of initial values is illustrated in the following pseudo code.

```
Dc_x_state_propagation(ckt) {
    Order_partitioned_stages(ckt, &num);
    For (I=0; I < num; I++) {
        Append_new_event(Event_queue) at time = I*delta_time;
    }
    while (Event_queue is not empty) {
        Hybrid_process(sg, tg);
        Save_dc_x_state(sg);
    }
}
```

With the initial values at the primary input propagated through the various levels and stages in the partitioned circuit, the hybrid simulation system applies the input stimuli (block 240) to the stages of the circuit for simulation. The state of the stages can then be evaluated using a routine that is similar to the simulation routines in SPICE, e.g., the sparse matrix solver. SPICE is described in more detail, e.g., in T. Quarles, A. R. Newton, D. O. Pederson, A Sangiovanni-Vincentelli "SPICE3 User's Manual" EECS department, UC Berkeley, May, 1993, and more details of the sparse matrix solver, e.g., maybe found in Kenneth S. Kundert, A Sangiovanni-Vincentelli "Sparse1.3: A Sparse Linear Equation Solver" EECS department, UC Berkeley, May, 1988, both of which are incorporated herein by reference. However, because hybrid notation is used, a single input stimulus can represent a plurality of state changes. Consequently, hybrid simulation system enumerates all the possible combinations of the hybrid input stimulus prior to analysis. The hybrid enumeration and analysis (block 250) is thus performed using the input stimuli. Hybrid enumeration and analysis is discussed in more detail in reference to FIG. 6. The hybrid simulation system performs hybrid enumeration and analysis for each stage, thereby obtaining the hybrid output state for each stage, and progresses to the next stage. The input vectors for the next stage are the hybrid output states of the previous stage. If one of the output vectors from a stage are applied to a stage prior to the stage, i.e., in a loop, the loop will be recognized as it had been marked during the ordering and propagating the initial values (block 230, FIG. 4). The hybrid simulation system will propagate the new vectors through the loop once, but will not repeat the loop. The process continues until there are no more stages (block 260), at which time the hybrid simulation system outputs the result for circuit at the primary output (block 270).

Figure 6:
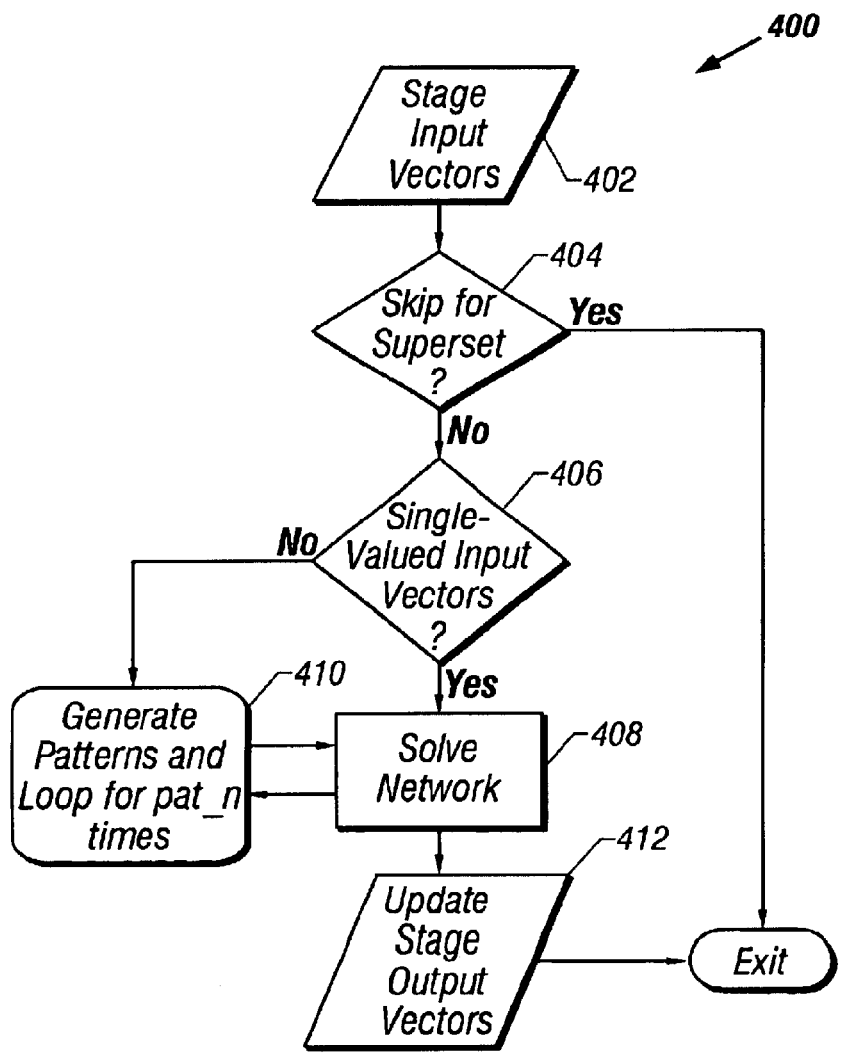
FIG. 6 is a flow chart of the hybrid enumeration and analysis process in accordance with an embodiment of the present invention.

FIG. 6 shows a flow chart 400 of the hybrid enumeration and analysis process in accordance with an embodiment of the present invention. Using the stage input vectors 402, which is, e.g., the input stimuli provided at step 240 in FIG. 4 or the output states from a previous stage, the hybrid simulation system first determines if the enumeration and analysis for the stage can be skipped (block 404). The hybrid enumeration and analysis may be skipped if the input stimulus represents a state change that is into a superset of the previous state, while the output value for the stage is already in the toggle T state. The superset relationships of the six possible hybrid states, i.e., 0, 1, X, R, F, and T, are defined as follows:

$$0 \epsilon X \epsilon R \epsilon T;$$

$$0 \epsilon X \epsilon F \epsilon T;$$

$$1 \epsilon X \epsilon R \epsilon T; \text{ and}$$

$$1 \epsilon X \epsilon F \epsilon T. \qquad \text{eq. 1}$$

Figure 7:
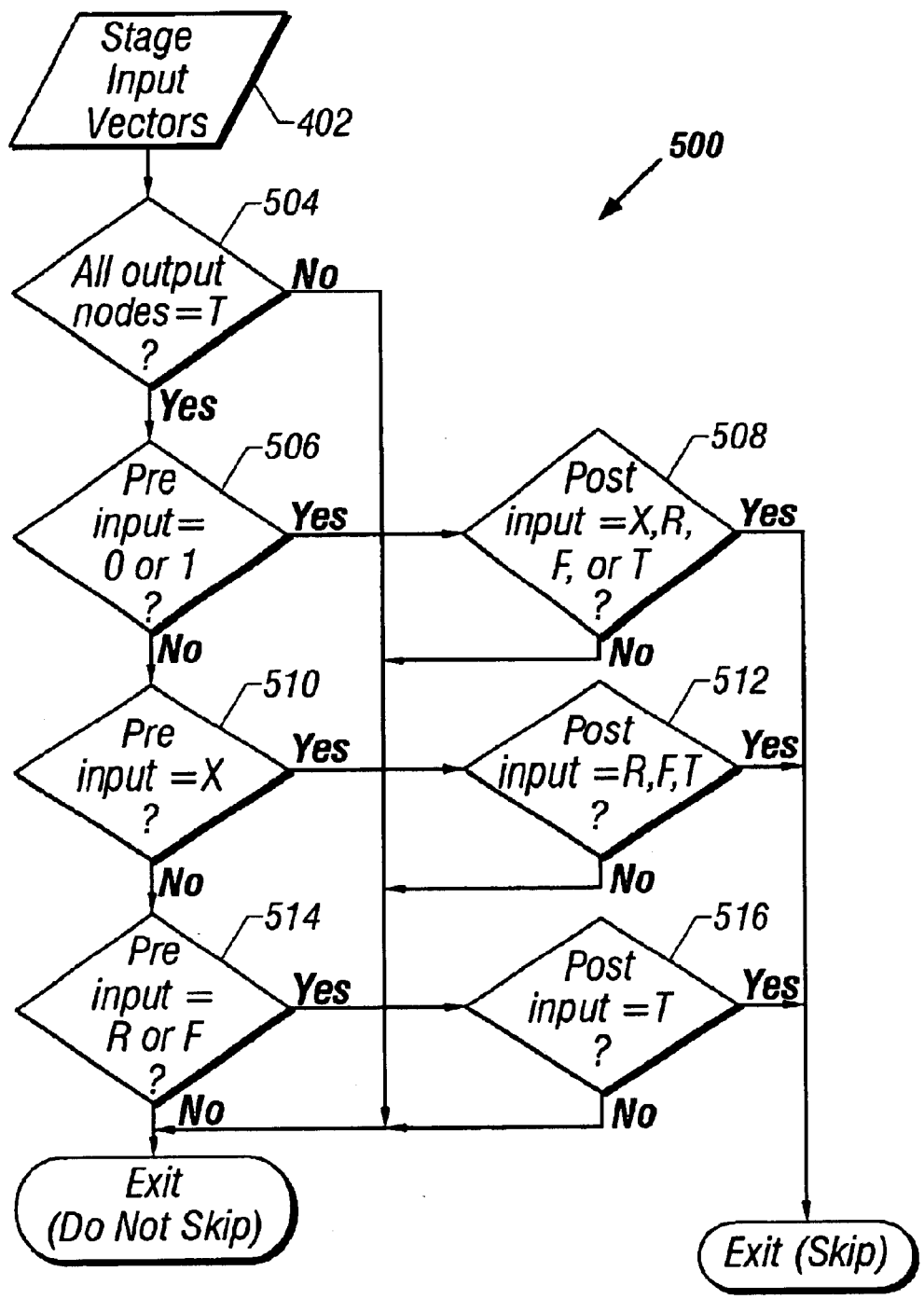
FIG. 7 is a flow chart of the process for determining whether to skip the hybrid enumeration and analysis for a stage.

FIG. 7 shows a flow chart 500 of the process for determining whether to skip the hybrid enumeration and analysis for a stage. After receiving the stage input vectors 402, a decision is made whether all the active output nodes for the stage are in the toggle T state (block 504). If any of the active output nodes for the stage are not in a toggle T state, the stage cannot be skipped and the process returns to the hybrid enumeration and analysis process shown in FIG. 6.

If all of the active output nodes are in the toggle "T" state, the trigger, i.e., the input stimulus for each input node, is then analyzed to determine if it changes state into a superset of the original state. Thus, as shown in decisions 506 and 508, if the prior input value, i.e., "pre input", is a logic 0 or a logic 1 and the new input value, i.e., "post input", is one of the X, R, F, or T states, the process returns to FIG. 6 and the hybrid enumeration and analysis for the stage is skipped. Similarly, as shown by decision blocks 510 and 512, if the prior input value is the X state, and the new input value is one of the R, F, or T states the process returns to FIG. 6 and the hybrid enumeration and analysis for the stage is skipped. As shown by decision blocks 514 and 516, if the prior input value is either the R or F states, and the new input value is the T state, the process returns to FIG. 6 and the hybrid enumeration and analysis for the stage is skipped. Otherwise, the process returns to FIG. 6 and the stage cannot be skipped.

The overall analysis to determine whether hybrid enumeration and analysis for a stage may be skipped is illustrated in the following pseudo code.

```
static int
all_output_in_T(Stage sg)
{
    for (all outputs nodes on of sg) {
        if (node_state(on) != state "T")
            return 0;
    }
    return 1;
}
/* node_state(node) is a routine that will return the current state of the
node. The current state of the node is recorded under the data structure
of node */
static int
trig_into_superset(trig)
{
    State pre, post;
    pre = trig->pre_st;
    post = trig->post_st;
    if(pre == (0, 1) && post == (X, R, F, T) ||
        pre == X   && post == (R, F, T) ||
        pre == (R, F) && post == T
    }
        return 1;
        else return 0;
}
```

By skipping the hybrid enumeration and analysis for a stage, the overall speed of the hybrid simulation may be increased without affecting the accuracy of the result.

Nevertheless, if desired, each stage the hybrid enumeration and analysis for each stage may be performed without determining whether or not skipping of the stage is possible, thereby obviating the need for block 404 in FIG. 6 and the process shown in FIG. 7.

Referring back to FIG. 6, if the hybrid enumeration and analysis cannot be skipped, a determination is made whether the input vectors for the stage are "single-valued," i.e., either a logic 0 or a logic 1 or a single transition. If the input values are single-valued, there is only one possible pattern for the input, hence no need for hybrid enumeration. The analysis for that stage may be done using a conventional simulation routine, such as SPICE. If, however, the input values are not single-valued, the simulation of that stage must include the hybrid enumeration and analysis. It should be understood that all the input vectors for the stage must be analyzed to determine if they are "single-valued".

Figure 8:
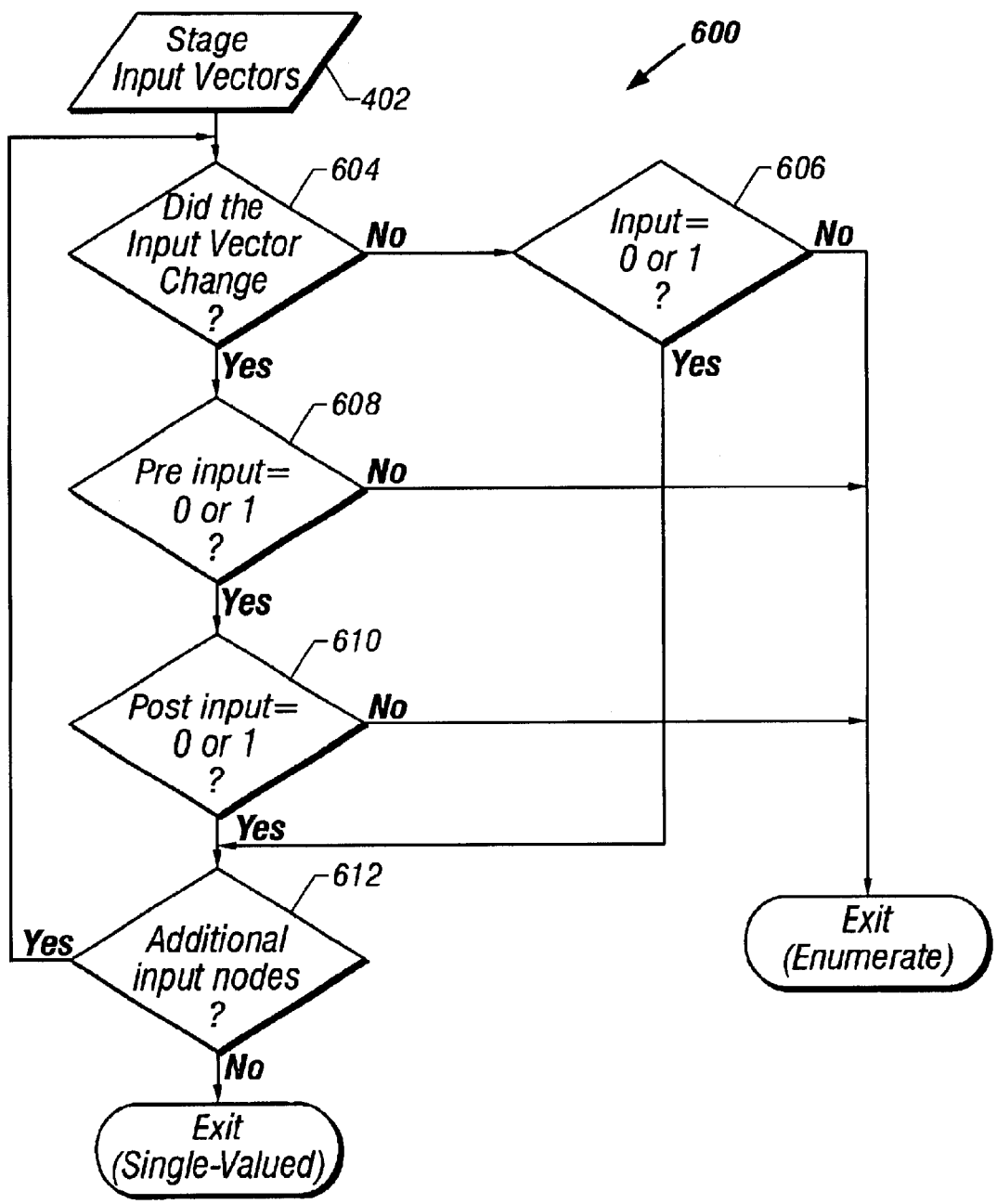
FIG. 8 is a flow chart of the process for determining whether the input value is "single valued".

FIG. 8 is a flow chart 600 of the process for determining whether the input values are "single-valued". As shown in FIG. 8, the process first determines whether the value of a stage input vector 402 changed value from the previous state (block 604). If the input vector did not change value and the current input vector is a logic 0 or a logic 1 (block 606), the input vector is single-valued and the process returns to flow chart 400 shown in FIG. 6. If, however, the input vector is not a logic 0 or a logic 1, the input vector is not single-valued and the process returns to flow chart 400 for hybrid enumeration.

If in block 604 it is determined that the input vector did change, i.e., the value of the input toggled, both the pre input value must a logic 0 or 1 (block 608) and the post input value must be a logic 0 or 1 (block 610) for the input vector to determined single-valued. Otherwise, the input vector is not single-valued and the process returns to flow chart 400 for hybrid enumeration. This process is performed for each input node (block 612).

The overall process to determine whether the input vectors are single-valued is further illustrated in the following pseudo code.

```
int
all_inputs_are_single_valued (Stage sg, Trig tg)
{
    for (all_inputs_of_sg) {
        if (input has toggle tg) {
            if(tg->pre_st != 0 && tg->pre_st != 1 ||
            tg->post_st != 0 && tg->post_st != 1)
                return 0;
        }
        else {/* input is steady state */
            if(input_state != 0 && input_state != 1)
                return 0;
        }
    }
    return 1;
}
```

The pre_st and post_st in the above pseudo code are part of the data structure of the trigger (Trig), i.e., the input vector, data type. Pre_st records the previous state before the triggering event and post_st records the next state after the triggering event.

Referring back to FIG. 6, if the input vectors are determined to be "single-valued" in block 406, the state of the stage is analyzed by solving the network using a routine that is similar to the simulation routines in SPICE, e.g., the sparse matrix solver (block 408). SPICE is described in more detail, e.g., in T. Quarles, A. R. Newton, D. O.

Pederson, A Sangiovanni-Vincentelli "SPICE3 User's Manual" EECS department, UC Berkeley, May, 1993, and more details of the sparse matrix solver, e.g., may be found in Kenneth S. Kundert, A Sangiovanni-Vincentelli "Sparse1.3: A Sparse Linear Equation Solver" EECS department, UC Berkeley, May, 1988, both of which are incorporated herein by reference.

However, if the input vectors are not "single-valued", i.e., any one of the input stimuli has an X, R, F, or T state, the simulation routine enumerates all the possible patterns of the hybrid input stimuli, and solves the network for each different pattern in a loop (blocks 410 and 408).

Figure 9:
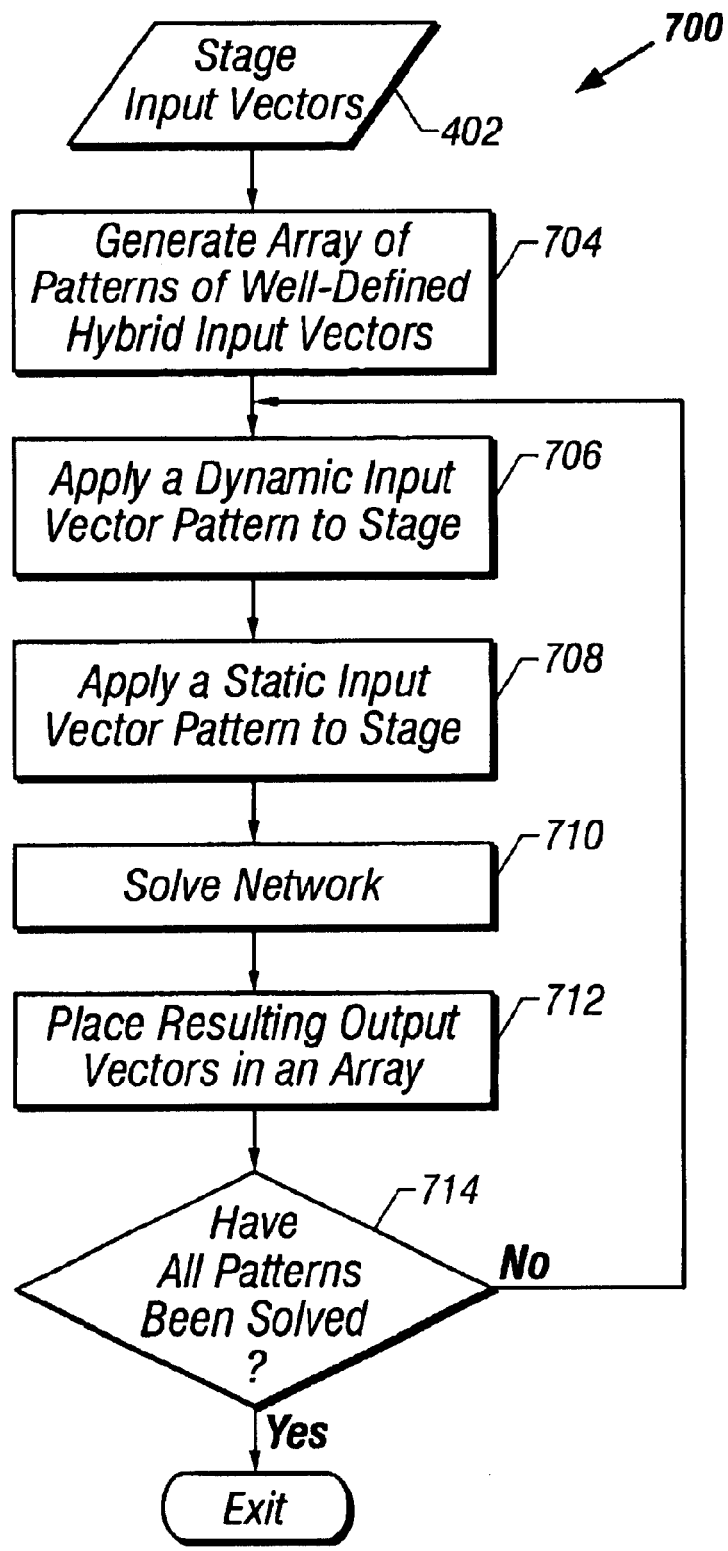
FIG. 9 is a flow chart of the enumeration and looped analysis performed by the hybrid simulation system.

FIG. 9 is a flow chart 700 of the enumeration and looped analysis (blocks 410 and 408 of FIG. 6) performed by the hybrid simulation system. As shown in FIG. 9, the hybrid simulation system enumerates the stage input vectors (block 402) by generating an array of patterns of well-defined input vectors (block 704), i.e., the hybrid input state vectors are decomposed into all possible combinations of states and/or transitions of the input vectors. The possible static states and dynamic transitions that the hybrid input state vectors are decomposed into are well-defined in that they have a known state or transition, i.e., static vectors are either a logic 0 or a logic 1, and dynamic vectors are either a rising state or a falling state. The possible conditions of the input vectors from the decomposed hybrid input state vectors are recorded as patterns in an array. Each pattern in the array is, thus, well-defined in that each pattern represents a single combination of the well-defined input vectors. The size of the array is dependent on the number of input nodes for the stage.

Figure 10:
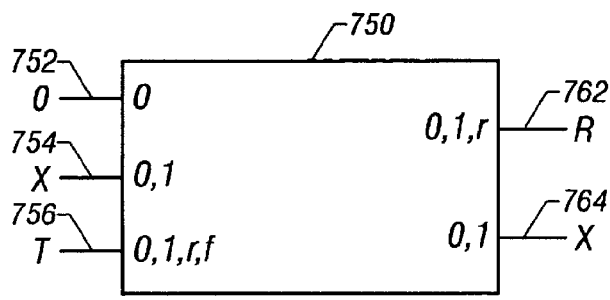
FIG. 10 is a block diagram of a stage illustrating possible patterns of the input vectors at the input terminals and output vectors at the output terminals.

FIG. 10 is a block diagram of a stage 750 illustrating possible patterns of the input vectors at the input terminals. Input terminal 752 of stage 750 has an input vector of a logic 0, input terminal 754 has an input vector of an X state, while input terminal 756 has an input vector of a T state. As indicated in FIG. 10, the input vector at terminal 754, i.e., X state, can be either a logic 0 or a logic 1, both of which are well-defined static states. The input vector at terminal 756, i.e., T, can be either a logic 0 or a logic 1, both of which are well-defined static states, or a rising "r" or falling "f" state, both of which are well-defined dynamic transitions. The well-defined dynamic rising and falling states are represented with lower case "r" and "f", respectively, to differentiate from the hybrid rising "R" state and falling "F" state, which are not well-defined (because they can be 0, 1, or r, or a 0, 1, or f, respectively). The array of patterns for the input vectors at stage 750 are generated using a cyclic rotation mechanism similar to the bit pattern changes in multi-bit binary number sequencing. Table 2 describes the possible input vector patterns for stage 750 shown in FIG. 10. In Table 2, each of the eight rows is a well-defined pattern, ready for conventional network solving simulation.

TABLE 2

| Input Terminal 752 | Input Terminal 754 | Input Terminal 756 |
|---|---|---|
| 0 | 0 | 0 |
| 0 | 0 | 1 |
| 0 | 0 | r |
| 0 | 0 | f |
| 0 | 1 | 0 |
| 0 | 1 | 1 |
| 0 | 1 | r |
| 0 | 1 | f |

With the hybrid enumeration complete, i.e., the possible patterns generated, one set of input vector from the pattern are applied to the stage. Thus, the stage is set using the well-defined dynamic input vectors (block 706) and static input vectors (block 708). The network is then solved for that particular pattern of input vectors (block 710). Because all the input vectors are well-defined, the network can be solved using a routine that is similar to the simulation routines in SPICE, e.g., the sparse matrix solver. During the circuit simulation, stages containing analog circuits are treated the same as stages containing digital circuits, but because analog circuitry is more sensitive to simulation accuracy, smaller time steps and accuracy tolerances may be used for stages containing analog circuits.

The resulting output vectors from the solved network are recorded as new states of the output nodes of the stage (block 712). The hybrid analysis is continued for each possible pattern in the array of patterns until all possible patterns have been solved (block 714). Each time the network is solved for a different pattern of input vectors, the resulting output vectors are recorded as new states in an array of possible output vectors (block 712). The array of patterns of output vectors is similar to the array of patterns of input vectors, where the size of the output array is dependent on the number of the output nodes of the stage. Once the network has been solved for all the input vector patterns, the array of patterns of output vectors for the stage are updated into hybrid notation, i.e., recomposed from possible states and/or transitions to the appropriate representative state, e.g., 0, 1, X, R, F, or T (block 412, shown in FIG. 6).

FIG. 10 illustrates updating the output vectors for stage 750, which has two output terminals 762 and 764. After solving the network for all given input vector patterns, the output terminal 762 will produce a logic 0, a logic 1 or a rising r state, while the output terminal 764 will produce either a logic 0 or a logic 1. When the output vectors of stage 750 are updated (block 412 in FIG. 6) the well-defined states are updated to a hybrid state, e.g., terminal 762 is updated to R state and terminal 764 is an X state.

The overall process of hybrid enumeration and analysis is further illustrated in the following pseudo code.

```
Hybrid_analysis(ckt) {
    hybrid_queue = Generate_hybrid_events from_input_stimulus();
    while (hybrid_event_queue is not empty) {
        Hybrid_process(sg, tg);
        Append_new_event (hybrid_event_queue);
    }
}
```

Where the event generation and appending can be done straightforward by defining an event data structure and an event linked list to represent the event queue. More details on routine Hybrid_process( ) are described in the following pseudo code.

```
typedef event {
    float time;
    node nd;
    hybrid_event event;
} event_t;
typedef event_queue {
    event_t *event;
    event_t *next;
} event_queue;
Hybrid_process (Stage sg, Trig tg)
```

-continued

```
/* sg is the stage under evaluation, tg is the hybrid triggering event */
{
    if(all_output_in_T(sg) && trig_into_superset(trig)) {
    /* Skip to boost up speed */
    return;
    }
    if( all_inputs_are_well_defined (sg, tg)) {
    /* only one combination, just like regular simulation */
    pattern = input_pattern (sg, tg);
    st = Network_solving (sg, pattern);
        Add_new_state(new, st);
    }
    else {
      pat_n = calculate_pattern_number(sg, trig);
      for (i=0;i<pat_n;i++) {
      set_dynamic_pattern(sg, trig, pattern);
      set_static_pattern (sg, trig, pattern);
      st = Network_solving (sg, pattern);
         Add_new_state(new, st);
      }
    }
    update_output_state(sg, new);
}
void
set_dynamic_pattern(sg, trig, pattern)
{
    for (input nodes in of sg) {
        if(in has toggle)
            pattern = next_toggle (in);
    }
}
void
set_static_pattern (sg, trig, pattern)
{
    for (input nodes in of sg) {
        if (in is static)
            pattern = next_state (node_state(in));
    }
}
```

Figure 11:
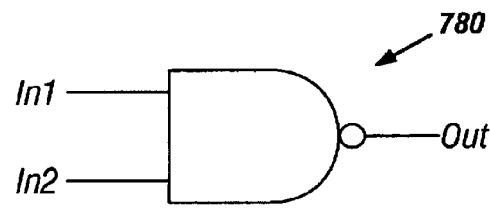
FIGS. 11 and 12 illustrate a NAND gate and a waveform resulting from hybrid simulation of the NAND gate.
Figure 12:
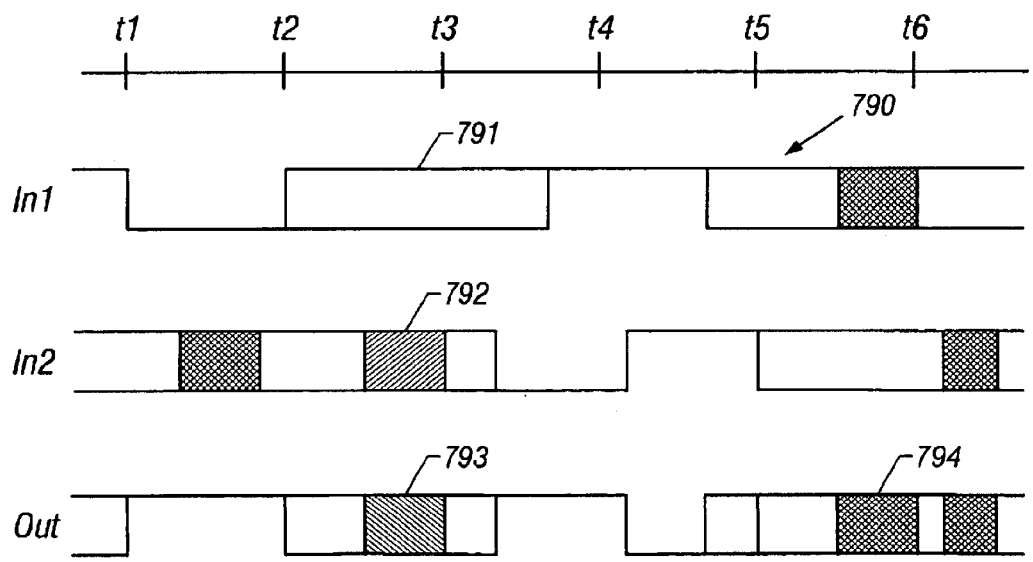

FIGS. 11 and 12 illustrate a NAND gate 780 with input terminals In1 and In2 and an output terminal Out, and a waveform 790 resulting from hybrid simulation of NAND gate 780. Region 791 or the waveform is an example of an X state, while regions 792, 793, and 794 are examples of rising, falling and toggle states. As will be understood by those skilled in the art, the waveform 790 may be used for timing, power, and signal integrity analysis.

As discussed above, large channel-connected stages may be further partitioned in accordance with the present invention. Because large channel-connected stages are time consuming to simulate, they are treated as special cases in hybrid simulation. In most cases only a few input signals of a large stage switch at the same time. The device direction setting based on the signal flow (as described in reference to block 220 in FIG. 4) is used to further partition a large stage into multiple small mutual-exclusive stages and save the partitioning results in database in a hierarchical manner. When simulating the large channel-connected stage, the process dynamically assembles those non-mutual-exclusive sub-stages connected to the triggering input vector into a sub-circuit for circuit simulation. The process continues from the output of the sub-circuit following the signal direction to further sub-circuits until the output of the large stage is reached.

Figure 13:
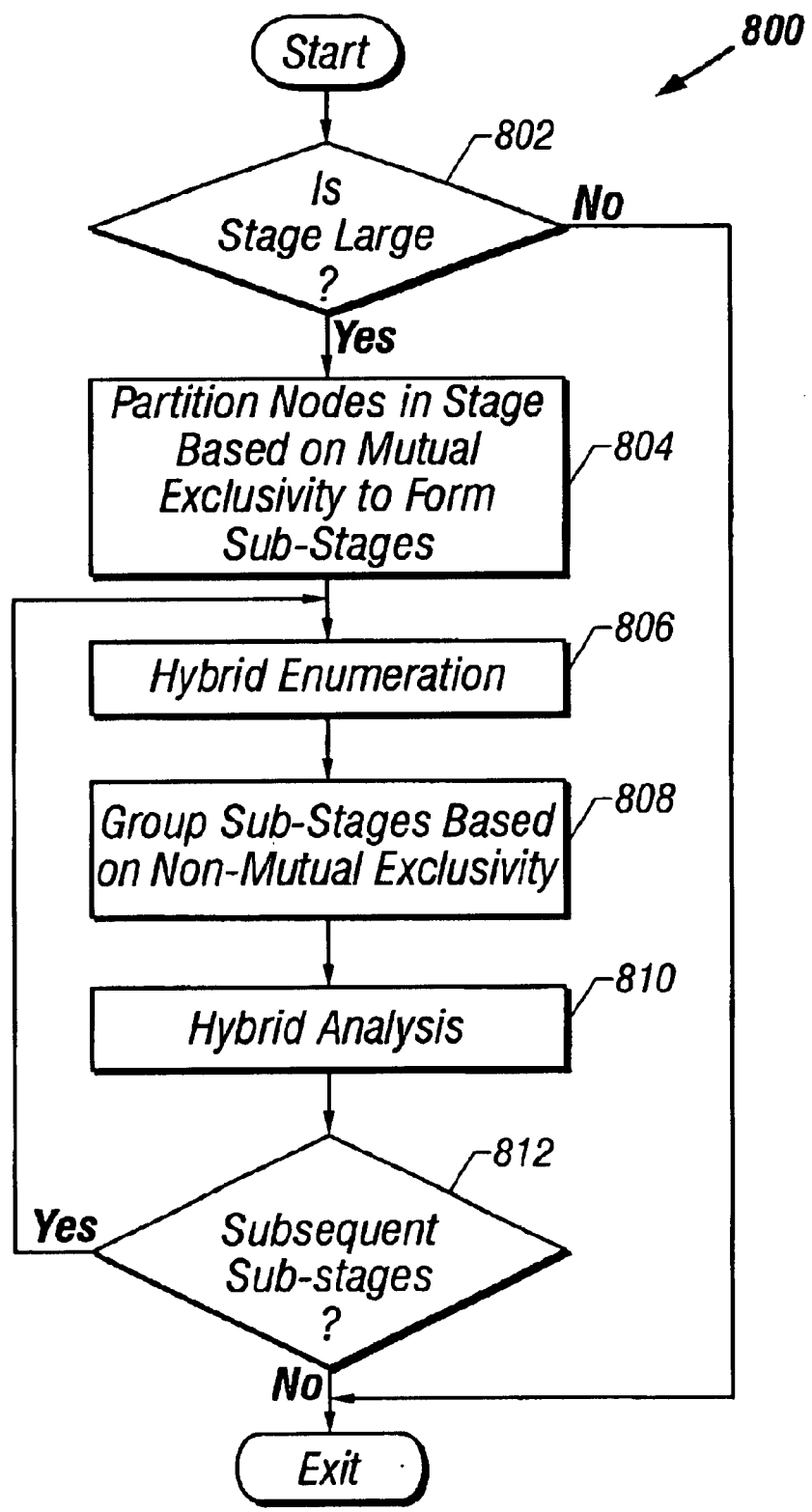
FIG. 13 is a flow chart of the hybrid simulation process for a large-channel connected stage.

FIG. 13 is a flow chart 800 of the hybrid simulation process for a large-channel connected stage. Flow chart 800 starts after, e.g., circuit partitioning (block 220) in FIG. 4. First, a determination is made whether the stage is a large stage (block 802). For example, if the stage includes a number of nodes that exceeds a predetermined threshold number, e.g., 100, the stage is considered large. Of course, the threshold number of nodes may vary as desired and may be designated by the user during a configuration setup routine. Moreover, if desired, other parameters may be used to determine whether a stage is large, such as number of input vectors, output vectors, or some combination of parameters.

If the stage is not large, the hybrid simulation process continues as described above. However, if the stage is large, the hybrid simulation system further partitions the stage into sub-stages based on mutual exclusivity of controlling nodes of devices in the stage (block 804). Mutual exclusivity of nodes is determined by examining the controlling gate signal of a device connected to the node. When the controlling gate signal is mutually exclusive, the node is considered as a mutually exclusive node. The connectivity at the mutually exclusive nodes is broken and the remaining channel-connected devices are grouped in sub-stages.

Next, the process performs hybrid enumeration (block 806), in a manner similar to that described above. The sub-stages are then grouped based on non-mutual exclusivity with the sub-stage of the triggering input (block 808). Thus, the sub-stages that are mutual exclusive to the sub-stage of the triggering input are excluded from the analysis. The hybrid analysis is then performed on the grouped sub-stages, in a manner similar to that described above (block 810). The process continues from the output of the sub-stages in the group, following the signal direction, to subsequent sub-stages until the output of the large stage is reached (block 812).

By dynamically assembling only those non-mutual-exclusive sub-stages connected to the triggering input for simulation, the mutually exclusive sub-stages are not simulated. Consequently, the speed of simulation can be drastically increased.

The overall process of hybrid simulation of a large channel-connected stage is further illustrated in the following pseudo code.

```
Hybrid_simulation_of_large_stage(large_stage) {
    Large_stage_partition(large_stage);
    hybrid_event_queue = Generate_hybrid_e-vents_from_in-
    put_stimulus (large_stage);
    While (hybrid_event_queue is not empty) {
    group_set_of_sub_stages_non_mutual_exclusive_with_trig-
    ger(&sg);
    Hybrid_process(sg, tg);
    If(output node of sg != output port of large_stage)
       Append_new_event(hybrid_event_queue);
    }
}
Large stage partition(large stage) {
    For (all nodes in the large stage) {
       If (the controlling gate signal of devices connected to the node
       are mutual exclusive)
          Mark the node as partitioning node;
    }
    break the connectivity at partitioning nodes;
    group the channel-connected devices into separate sub-stages;
}
```

In another aspect of the present invention, the hybrid simulation system eliminates false state input enumeration. A false state input enumeration is caused by a reconvergent path that causes the original cause in the X-enumeration to be lost.

Figure 14:
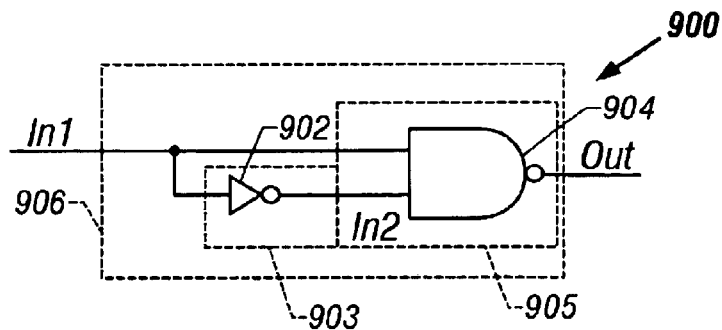
FIG. 14 illustrates one example of a false state input enumeration.

FIG. 14 illustrates one example of a false state input enumeration. FIG. 14 shows a circuit 900 including an inverter 902 and a NAND gate 904, where the inverter 902 and NAND gate 904 share an input terminal In 1 and the output terminal of the inverter 902 is coupled to a second input terminal In2 of the NAND gate 904. Because inverter 902 will invert the state of In1 and one input terminal NAND gate 904 will always be a logic 0. Accordingly, NAND gate 904 will produce a constant logic 1 on output node Out. Thus, circuit 900 should have a constant steady state without transitions.

However, when circuit 900 is partitioned into two stages, stage 903 includes inverter 902 and stage 905 includes NAND gate 904, a false state input enumeration can occur. If input terminal In1 has an input value of X, then stage 903 will produce an X state after evaluation. Thus, when stage 905 is evaluated, both input terminals In1 and In2 for NAND gate 904 will have an X state. Hybrid enumeration at stage 905 will consequently produce four input patterns: "00", "01", "10" and "11". After hybrid analysis of stage 905, the four patterns cause the output node Out of stage 905 to have an X state. Thus, the hybrid enumeration using the regular partitioning cannot capture the actual constant result of the circuit and will generate a false path report.

To overcome the false state input enumeration problem, the scope for the hybrid enumeration is enlarged. Thus, as shown in FIG. 14, the entire circuit 900 is defined as a complex cell 906, which has one input terminal In1 and one output node Out. Thus, when the input terminal In1 has an X state", only two patterns are enumerated, i.e., a logic 0 and a logic 1. Applying both patterns to cell 906 will result in "Out" being a constant-logic 1 state.

Figure 15:
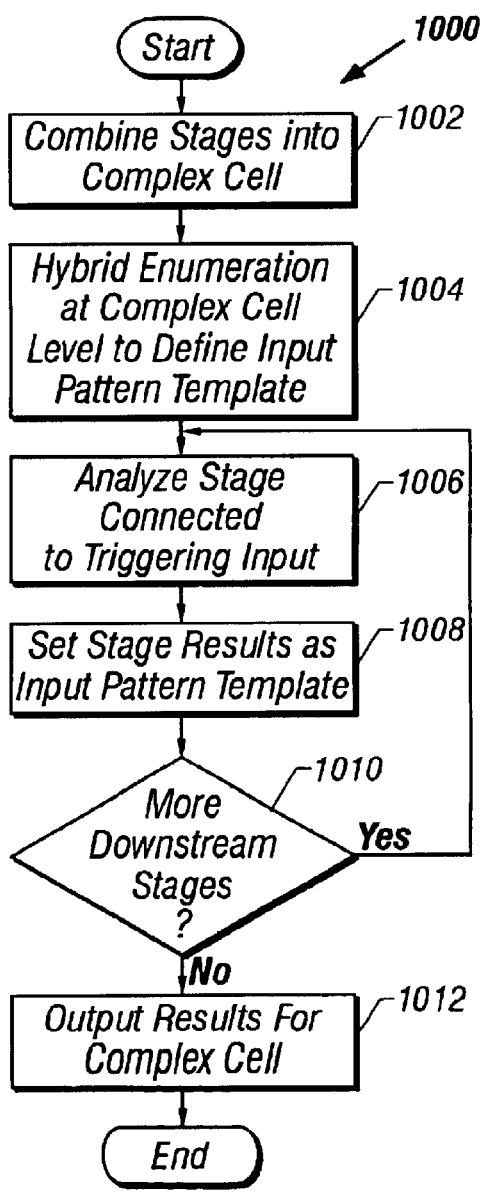
FIG. 15 is a flow chart showing the process of elimination of false state input enumeration.

FIG. 15 is a flow chart 1000 showing the process of elimination of false state input enumeration due to reconvergent paths. In accordance with an embodiment of the present invention, this kind of false paths is eliminated by grouping the whole reconvergence into a "complex cell" unit for the state enumeration process (block 1002). The grouping into a complex cell can be enabled, e.g., when a user specifies that a complex cell is necessary, for example, during configuration setup. The user can also help identify the scope of a "complex cell" by specifying a "cell" parameter in the sub-circuit definitions of the input netlist.

In practice, the larger scope of a complex cell can contain various smaller stages, e.g., complex cell 906 contains both inverter 902 and NAND gate 904, and thus, a complex cell can be inefficient to analyze. To enhance the efficiency, the hybrid analysis is not run on the entire complex cell. Instead, the hybrid enumeration and analysis steps are performed on different levels. In other words, the hybrid enumeration is performed at the complex cell level (block 1004), and the analysis is performed on the smaller stages of the complex cell (block 1006). An input pattern template is created during the process to record the pattern generated at the larger complex cell level (block 1004). This template is then referred to by all the small stages during network solving simulations. The output states of each stage in the complex cell is then defined as the input pattern template. The process continues for all the stages within the complex cell (block 1010). The process continues until there are no more downstream stages in the complex cell at which point the results for the complex cell are output (block 1012). Thus, as shown in FIG. 14, the hybrid enumeration is performed for the complex cell 906, and network solving is performed on the stages 903 and 905 using the array of patterns of well-defined states generated at the complex cell level. Consequently, while the scope of the hybrid enumeration has been enlarged, the actual network solving is still done at the original smaller stage level to avoid the computing complexity of larger stage.

The overall process of elimination of false state input enumeration is further illustrated in the following pseudo code.

```
False_inputs_enumeration(complex_cell) {
  Combine_small_leaf_cells_into_com-
  plex_cell_stage(&cplx_sg);
  pat_n = calculate_pattern_number(cplx_sg, trig);
  for(i=0; i <pat_n; i++) {
    set_dynamic_pattern(cplx_sg, trig, pattern);
    set_static_pattern (cplx_sg, trig, pattern);
      hybrid_event_queue = Generate_hybird_events_from_in-
      put_pattern(cplx_sg);
      Input_pattern_template = pattern;
      While (hybrid_event_queue is not empty) {
        Sg = leaf_cell_connected to triggering input;
        St = Network_solving(sg, input_pattern_template);
        Input_pattern_template = output results of Sg;
        If (output node of sg != output port of cplx_sg)
          Append_new_event(hybrid_event_queue);
        Else
          Add_new_state(new, st);
      }
    }
    update_output_state(cplx_sg, new);
}
```

Thus, the present invention provides an improved method and apparatus for analyzing and verifying circuit designs, and in particular circuit designs that include both analog and digital circuitry. The hybrid simulation system solves problems associated with traditional static and dynamic approaches, while maintaining the accuracy advantage of dynamic simulation and efficiency advantage of static analysis.

It is important to note that while the present invention has been described in the context of a fully functioning data processing system, those of ordinary skill in the art will appreciate that the processes of the present invention are capable of being distributed in a form of a computer readable medium of instructions and a variety of forms and that the present invention applies equally regardless of the particular type of signal bearing media actually used to carry out the distribution. Examples of computer readable media include: recordable-type media such a floppy discs and CD-ROMs and transmission-type media such as digital and analog communications links.

Moreover, the description of the present invention has been presented for purposes of illustration and description, but the present invention is not intended to be limited to the form disclosed. Many modifications and variations will be apparent to those of ordinary skill in the art. While the present invention has been described in particular embodiments, it should be understood that the present invention should not be construed as limited to such embodiments, but rather construed according to the below claims.

Although the present invention is illustrated in connection with specific embodiments for instructional purposes, the present invention is not limited thereto. Various adaptations and modifications may be made without departing from the scope of the invention. For example, certain process steps, such as skipping stages and determining if the input vectors are single-valued, may be eliminated or varied. Therefore, the spirit and scope of the below claims should not be limited to the foregoing description.

What is claimed is:

1. A method of simulating a circuit design that includes at least one of analog and digital circuitry, said method comprising:

storing device information and node connectivity of said circuit design;

partitioning said circuit design into a plurality of stages;

applying a plurality of input vectors to a stage, wherein at least one of said plurality of input vectors comprises a hybrid vector that represents a possible signal states;

enumerating tho possible combinations of signal states of said plurality of input vectors to said stage;

solving said stage for said possible combinations of signal states of said plurality of input vectors; and updating at least one output vector of said stage.

2. The method of claim 1, wherein said hybrid vector further represents at least one possible signal transition, wherein said enumerating enumerates the possible combinations of signal states and signal transitions and solving said stage solves for said possible combinations of signal states and signal transition.

3. The method of claim 2, wherein said hybrid vector further represents a plurality of possible signal transitions.

4. The method of claim 1, wherein:

said at least one output comprises a hybrid vector that represents a plurality of possible signal states, said method further comprising:

applying said at least one output vector of said stage as an at least one input vector of a subsequent stage;

enumerating the possible combinations of signal states of said at least one input vector of said subsequent stage;

solving a network in said subsequent stage for all said possible combinations of signal states of said at least one input vector of said subsequent stage; and updating at least one output vector of said subsequent stage.

5. The method of claim 4, further comprising repeating said applying, enumerating, solving and updating for a plurality of subsequent stages.

6. The method of claim 5, further comprising outputting a result for said circuit design, wherein said result includes at least an output vector from a last stage.

7. The method of claim 5, further comprising skipping said enumerating, solving and updating for a subsequent stage with all current input vectors being hybrid vectors representing states that are a superset of the previous states of the input vectors and with all output vectors being hybrid vectors representing all possible signal transitions, wherein a first state is a superset of a second state if the second state represents a plurality of possible signal states, one of which is the same as said first state.

8. The method of claim 5, further comprising skipping said enumerating for a subsequent stage with all current input vectors unchanged from their previous states and each current input vector having only one possible signal state.

9. The method of claim 5, further comprising skipping said enumerating for a subsequent stage with each of the current input vectors having only one possible signal state and each of the previous input vectors having only one possible signal state.

10. The method of claim 5, wherein the stage comprises a channel-connected stage, the method further comprising:

further partitioning the a stage into sub-stages, each sub-stage having at least one mutually exclusive controlling node;

wherein said hybrid vector comprises a triggering input;

enumerating possible combinations of signal states of said triggering input to said stage;

grouping together at least two of said sub-stages based on non-mutual exclusivity with said triggering input;

solving a network in the sub-stage group that receives said at least one input vector for all said possible combinations of signal states;

updating an output vector of said sub-stage group; and repeating said applying said output vector of said sub-stage as a triggering input vector in a subsequent sub-stage and enumerating the combinations of input vector and grouping non-mutual exclusive sub-stages with said triggering input and solving a network in said subsequent sub-stage group and updating said output vector of said subsequent sub-stage group until no more sub-stages exist in said channel-connected stage.

11. The method of claim 10, wherein the stage comprises a circuit design having gates to control devices coupled to nodes, wherein further partitioning the stage into sub-stages comprises:

breaking the connectivity of a device in said stage at a mutually exclusive node to form a sub-stage.

12. The method of claim 5, further comprising:

combining a plurality of stages into a complex cell;

applying at least one input vector to said complex cell;

enumerating the possible combinations of signal states of said at least one input vector to said complex cell;

solving a network in a stage in said complex cell that receives said at least one input vector for all said possible combinations of signal states;

updating an output vector of said stage;

applying said output vector of said stage as an input vector to a subsequent stage within said complex cell;

solving a network in said subsequent stage within said complex cell;

updating an output vector of said subsequent stage; and repeating said updating, and applying said output vector of said stage as an input vector to a subsequent stage within said complex cell and solving the network in said subsequent stage until no more stages exist in said complex cell.

13. The method of claim 1, wherein enumerating possible combinations of signal states comprises generating an array of patterns of said possible combinations of signal states, said method further comprising:

applying one of said array of patterns of said possible combinations of signal states to said stage;

solving the network in said stage for said one of said patterns;

storing resulting output vectors in an output array of patterns of possible combinations of signal states;

repeating said applying, solving and storing for each of said patterns of said possible combinations of signal states to said stage; and updating the output vectors for the stage by recomposing the possible patterns from said output array into output vectors that represent a plurality of possible signal states.

14. In a device for simulating a circuit design that includes at least one of analog and digital circuitry, a computer-usable medium having computer-readable program code embodied therein for causing a computer to perform operations comprising:

storing device information and node connectivity of said circuit design;

partitioning said circuit design into a plurality of stages;

applying a plurality of input vectors to a stage, wherein at least one of said plurality of input vectors comprises a hybrid vector that represents a plurality of possible signal states;

enumerating possible combinations of signal states of said plurality of input vectors to said stage;

solving said stage for said possible combinations of signal states of said plurality of input vectors to said stage; and updating at least one output vector of said stage.

15. The computer-usable medium as recited in claim 14, wherein said hybrid vector further represents at least one possible signal transition, wherein said enumerating enumerates the possible combinations of signal states and signal transitions and said solving the stage solves for said possible combinations of signal states and signal transition.

16. The computer-usable medium as recited in claim 15, wherein said hybrid vector further represents a plurality of possible signal transitions.

17. The computer-usable medium as recited in claim 13, wherein:

at least one of said output vectors comprises a hybrid vector that represents a plurality of possible signal states, wherein the computer-usable medium causes a computer to further perform operations comprising:

applying said at least one output vector of said stage as an at least one input vector of a subsequent stage;

enumerating the possible combinations of signal states of said at least one input vector of said subsequent stage;

solving a network in said subsequent stage for all said possible combinations of signal states of said at least one input vector of said subsequent stage;

updating at least one output vector of said subsequent stage; and repeating said applying, enumerating, solving and updating for a plurality of subsequent stages.

18. The computer-usable medium as recited in claim 17, wherein the computer-usable medium causes a computer to further to output a result for said circuit design, wherein said result includes at least an output vector from a last stage.

19. The computer-usable medium as recited in claim 17, wherein the computer-usable medium causes a computer to skip said enumerating, solving and updating for a subsequent stage with all current input vectors being hybrid vectors representing states that are a superset of the previous states of the input vectors and with all output vectors being hybrid vectors representing all possible signal transitions, wherein a first state is a superset of a second state if the second state represents a plurality of possible signal states one of which is the same as said first state.

20. The computer-usable medium as recited in claim 17, wherein the computer-usable medium causes a computer to skip said enumerating for a subsequent stage with all current input vectors unchanged from their previous states and each current input vector having only one possible signal state.

21. The computer-usable medium as recited in claim 17, wherein the computer-usable medium causes a computer to skip said enumerating for a subsequent stage with each of the current input vectors having only one possible signal state and each of the previous input vectors having only one possible signal state.

22. The computer-usable medium as recited in claim 17, wherein the stage comprises a channel-connected stage, and wherein the computer-usable medium causes a computer to further perform operations comprising:

further partitioning the stage into sub-stages, each sub-stage having at least one mutually exclusive controlling node;

wherein said hybrid vector comprises a triggering input;

enumerating tho possible combinations of signal states of said triggering input to said stage;

grouping together at least two sub-stages based on non-mutual exclusivity with said triggering input;

solving a network in the sub-stage group that receives said at least one input vector for all said possible combinations of signal states;

updating an output vector of said sub-stage group; and repeating said applying said output vector of said sub-stage as a triggering input vector in a subsequent sub-stage and enumerating the combinations of input vector and grouping non-mutual exclusive sub-stages with said triggering input and solving the network in said subsequent sub-stage group and updating said output vector of said subsequent sub-stage group until no more sub-stages exist in said channel-connected stage.

23. The computer-usable medium as recited in claim 22, wherein the stage comprises a circuit design having gates to control devices coupled to nodes, wherein further partitioning the a stage into sub-stages comprises:

breaking the connectivity of a device in said stage at a mutually exclusive node to form a sub-stage.

24. The computer-usable medium as recited in claim 17, wherein the computer-usable medium causes a computer to further perform operations comprising:

combining a plurality of stages into a complex cell;

applying at least one input vector to said complex cell;

enumerating the possible combinations of signal states of said at least one input vector to said complex cell;

solving a the network in a stage in said complex cell that receives said at least one input vector for all said possible combinations of signal states;

updating an output vector of said stage;

applying said output vector of said stage as an input vector to a subsequent stage within said complex cell;

solving a network in said subsequent stage within said complex cell;

updating an output vector of said subsequent stage; and repeating said updating and applying said output vector of said stage as an input vector to a subsequent stage within said complex cell and solving the network in said subsequent stage until no more stages exist in said complex cell.

25. The computer-usable medium as recited in claim 14, wherein enumerating possible combinations of signal states comprises generating an array of patterns of said possible combinations of signal states, said operations further comprising:

applying one of said array of patterns of said possible combinations of signal states to said stage;

solving a network in said stage for said one of said patterns;

storing resulting output vectors in an output array of patterns of possible combinations of signal states;

repeating said applying, solving and storing for each of said patterns of said possible combinations of signal states to said stage; and updating the output vectors for the stage by recomposing the possible patterns from said output array into output vectors that represent a plurality of possible signal states.

26. A method of simulating a circuit design that includes at least one of analog and digital circuitry, said method comprising:

storing device information and node connectivity of said circuit design;

partitioning said circuit design into a plurality of stages;

applying a plurality of input vectors to a stage, wherein at least one of said plurality of input vectors comprises a hybrid vector that represents a plurality of possible signal states and possible signal transitions;

enumerating possible combinations of signal states and signal transitions of said plurality of input vectors to said stage;

solving a network in said stage for said possible combinations of signal states and signal transitions of said plurality of input vectors to said stage; and updating at least one output vector of said stage.

27. The method of claim 24, wherein enumerating the possible combinations of signal states and signal transitions comprises generating an array of patterns of said possible combinations of signal states and signal transitions, said method further comprising:

applying one of said array of patterns of said possible combinations of signal states and signal transitions to said stage;

solving the network in said stage for said one of said patterns;

storing resulting output vectors in an output array of patterns of possible combinations of signal states and signal transitions;

repeating said applying, solving and storing for each of said patterns of said possible combinations of signal states and signal transitions to said stage; and updating the output vectors for the stage by recomposing the possible patterns from said output array into output vectors that represent a plurality of possible signal states and possible signal transitions.

* * * * *